(12) United States Patent
Clark et al.

(10) Patent No.: US 7,719,304 B1
(45) Date of Patent: May 18, 2010

(54) RADIATION HARDENED MASTER-SLAVE FLIP-FLOP

(75) Inventors: Lawrence T. Clark, Phoenix, AZ (US); Jonathan E. Knudsen, Austin, TX (US)

(73) Assignee: Arizona Board of Regents for and on behalf of Arizonia State University, Scottsdale, AZ (US)

( * ) Notice: Subject to any disclaimer, the term of this patent is extended or adjusted under 35 U.S.C. 154(b) by 226 days.

(21) Appl. No.: 12/117,320

(22) Filed: May 8, 2008

Related U.S. Application Data

(60) Provisional application No. 60/916,753, filed on May 8, 2007.

(51) Int. Cl.
*H03K 19/007* (2006.01)
(52) U.S. Cl. .............................. 326/14; 326/46; 326/15
(58) Field of Classification Search ................... 326/37, 326/38, 46, 9, 11, 14, 15
See application file for complete search history.

(56) References Cited

U.S. PATENT DOCUMENTS

| 6,127,864 | A | 10/2000 | Mavis et al. | |
|---|---|---|---|---|
| 7,619,455 | B2 * | 11/2009 | Carlson et al. | 327/212 |
| 2009/0219752 | A1 * | 9/2009 | Wissel | 365/154 |

OTHER PUBLICATIONS

"The 88-Inch Cyclotron: History Building the Future," Obtained online from http://user88.lbl.gov.subpage2.html.
Benedetto, J. et al., "Heavy Ion-Induced Digital Single-Event Transients in Deep Submicron Processes," IEEE Transactions on Nuclear Science, Dec. 2004, pp. 3480-3485, vol. 51, No. 6, IEEE.
Calin, T. et al., "Upset Hardened Memory Design for Submicron CMOS Technology," IEEE Transactions on Nuclear Science, Dec. 1996, pp. 2874-2878, vol. 43, No. 6, IEEE.
Gadlage, Matthew J. et al., "Single Event Transient Pulsewidths in Digital Microcircuits," IEEE Transactions on Nuclear Science, Dec. 2004, pp. 3285-3290, vol. 51, No. 6, IEEE.
Lacoe, Ronald C. et al., "Application of Hardness-By-Design Methodology to Radiation-Tolerant ASIC Technologies," IEEE Transactions on Nuclear Science, Dec. 2000, pp. 2334-2341, vol. 47, No. 6, IEEE.
Mavis, David G. et al., "Soft Error Rate Mitigation Techniques for Modern Microcircuits," Proceedings of the IEEE Reliability Physics Symposium, 2002, pp. 216-225, IEEE.
"Single Event Effect Criticality Analysis (SEECA)," Feb. 15, 1996, NASA Headquarters, obtained online at http://radhome.gsfc.nasa.gov/radhome/papers/seecai.htm.
"Tandem Van de Graaff," Feb. 28, 2008, obtained online at http://www.bnl.gov/bnlweb/facilities/TVdG.asp.
Turowski, M. et al., "Mixed-Mode Simulation and Analysis of Digital Single Event Transients in Fast CMOS ICs," 14 International Conference of Mixed Design, Jun. 21-23, 2007, pp. 433-438, Department of Microelectronics & Computer Science, Technical University of Lodz.

\* cited by examiner

*Primary Examiner*—Don P Le
(74) *Attorney, Agent, or Firm*—Withrow & Terranova, P.L.L.C.

(57) ABSTRACT

The present invention provides a radiation hardened flip-flop formed from a modified temporal latch and a modified dual interlocked storage cell (DICE) latch. The temporal latch is configured as the master latch and provides four output storage nodes, which represent outputs of the temporal latch. The DICE latch is configured as the slave latch and is made of two cross-coupled inverter latches, which together provide four DICE storage nodes. The four outputs of the temporal latch are used to write the four DICE storage nodes of the DICE latch. The temporal latch includes at least one feedback path that includes a delay element, which provides a delay.

24 Claims, 12 Drawing Sheets

US 7,719,304 B1

RADIATION HARDENED MASTER-SLAVE FLIP-FLOP

This application claims the benefit of U.S. provisional application Ser. No. 60/916,753 filed May 8, 2007, the disclosure of which is incorporated herein by reference in its entirety.

GOVERNMENT FUNDING

The invention described herein was made with government support under grant number F29601 02-2-299, awarded by the Air Force Research Laboratory. The United States Government has certain rights in the invention.

FIELD OF THE INVENTION

The present invention relates to latches, and in particular to a radiation hardened master-slave flip-flop.

BACKGROUND OF THE INVENTION

Electronic circuits, and in particular circuits that involve storing electronic states, are vulnerable to high-energy subatomic particles and electromagnetic radiation. Many high-altitude flight, outer space, military, and nuclear applications require that such vulnerability be reduced to an acceptable level. The techniques that are used to reduce the vulnerability of these circuits to the effects of radiation are generally referred to as radiation hardening. For the most part, radiation hardening involves employing special circuit designs, circuit layouts, the use of select materials, or any combination thereof to increase the robustness of the circuit. Long-term radiation effects that may impact the long-term functionality of the circuit are referred to as total ionizing dose (TID) effects and are often mitigated using special circuit layer techniques.

Another type of radiation effect that is becoming more of an issue is referred to a single event effect (SEE). When a high-energy particle passes through a semiconductor providing the electronic circuit, excess charge may be left in the semiconductor along the path through which the particle passes. If excess charge is left on or near a node that is charged to a level representing a desired logic state, the excess charge may change the level of charge at the node. The change in charge level may result in the node changing from the desired logic state to another logic state. For example, if an ionized particle of radiation passes through a bi-state storage node that is charged for a logic 1, excess electrons from the ionized particle may collect at the storage node and discharge the storage node to a charge level corresponding to a logic 0. The effect of the change in charge level of the storage node may result in a temporary transient, where the storage node returns to the charge level for a logic 1 and does not upset the overall output of the of the electronic circuit. This type of SEE is referred to as a single event transient (SET). If the effect of the change in charge level of the storage node completely changes the output of the circuit, where the output does not return to the proper state, a single event upset (SEU) is said to occur. Generally, SETs and SEUs are temporary, unlike TID effects, which are more permanent, long-term radiation effects.

Latches are frequently used circuits that include storage nodes and benefit from being hardened to radiation. Exemplary radiation hardened latches include the dual interlocked storage cell (DICE) latch and a classic temporal latch. A traditional DICE latch is illustrated in FIG. 1. The DICE latch includes two cross-coupled inverter latches formed from PMOS transistors T1-T4 and complementary NMOS transistors T5-T8. The first cross-coupled inverter latch is formed from transistors T1, T2, T5, and T6 while the second cross-coupled inverter latch is formed from transistors T3, T4, T7, and T8.

Notably, node X0 is formed where transistors T1 and T5 are coupled, node X1 is formed where transistors T2 and T6 are coupled, node X2 is formed when transistors T3 and T7 are coupled, and node X3 is formed where transistors T4 and T8 are coupled. Node X0 is coupled to the gate of transistor T2 as well as the gate of transistor T8. Node X1 is coupled to the gates of transistors T5 and T3. Node X2 is coupled to the gates of transistors T6 and T4. Node X3 is coupled to the gates of transistors T7 and T1, and provides the output Q of the DICE latch.

The traditional DICE latch has only two inputs, which are connected to nodes X0 and X2. These two inputs are represented as nodes M0 and M1, which are respectively coupled to nodes X0 and X2 through pass transistors T9 and T10. A clock signal, CLKb, controls when the values on nodes M0 and M1 are written to nodes X0 and X2. As illustrated, when the clock signal CLKb is asserted low, the values on nodes M0 and M1 are written to nodes X0 and X2.

Generally, node X0 is at the same state as node X2. Similarly, node X1 is at the same state as node X3, which is the opposite state of nodes X0 and X2. Accordingly, the output Q, which corresponds to node X3, is generally the opposite logic state that is stored on nodes X0 and X1.

To radiation harden the DICE latch, the nodes X0-X3 must be physically separated from each other to an extent that will prevent any two of the nodes X0-X3 from being hit by a single radiation particle. As such, if one of the nodes X0-X3 is struck by a radiation particle and as a result has its state changed, the remaining nodes X0-X3 will effectively override the state change at the affected node such that the output Q is at most subjected to a transient glitch. The overall state of the DICE latch is not upset. When the affected node X0-X3 changes state in response to being struck by the radiation particle, the remaining nodes X0-X3 will operate to restore the affected node X0-X3 to its proper state.

One of the drawbacks of the traditional DICE latch is that it is prone to capturing the wrong logic states if nodes M0 and M1 have the wrong logic state when the clock signal CLKb is asserted low and the DICE latch is in a transparent mode. Although the DICE latch is relatively compact and has been proven effective in mitigating SEUs, it is vulnerable to SETs while in a transparent mode. Accordingly, there is a need for a technique to provide radiation hardened DICE latches that are not vulnerable to SETs while in transparent modes.

A classic temporal latch is illustrated in FIG. 2. The temporal latch employs three redundant feedback paths that are separated in time by intentionally differing delays. As illustrated, the first feedback path corresponds to node N2, the second feedback path corresponds to the delay circuit D1 and node MDb, and the third feedback path corresponds to delay circuits D2 and D3 as well as node MDDb. The delay circuits D1, D2, and D3 each provide a fixed delay δ. Those skilled in the art will recognize that the delays provided by each of the delay circuits D1, D2, and D3 may be different from one another, but for the purposes of illustration they are assumed to each provide the same delay δ.

The inputs to the temporal latch are a data input D and a clock signal CLK. The data input D is passed through a pass gate formed by transistors T11 and T12 to a node N1. The logic state of node N1 is inverted by an inverter I1 and presented to the beginning of each of the three redundant feedback paths. Each of the three redundant feedback paths terminates a corresponding input of an inverting majority gate MG1. The basic functionality of a majority gate is to provide an output corresponding to that of the majority of the inputs.

An exemplary majority gate is depicted in FIG. 3. As illustrated, the majority gate has three inputs, input A, input B, and input C. The majority gate is formed from six PMOS transistors T15-T20 and six NMOS transistors T21-T26, which are arranged in three complementary inverter stacks. When any two or more of the inputs A, B, and C are a logic 1, at least one pair of series NMOS transistors T21-T26 are turned on and pull the output OUT to a logic 0. Similarly, when any two or more of the inputs A, B, and C are a logic 0, at least one pair of the PMOS transistors T15-T20 are turned on and pull the output OUT to a logic 1. For example, if inputs A and B are a logic 1 and input C is a logic 0, transistors T21 and T22 are turned on and the output OUT is pulled to a logic 0. The other two stacks that include transistors T23-T26 are not pulled to a logic 0, because transistors T24 and T26, which are driven by input C, are turned off. Although input C is a logic 0, this will not affect the output OUT.

Returning to FIG. 2, the majority gate MG1 will receive three inputs from the three feedback paths and provide an output that corresponds to the majority of the three inputs. For example, if two or three of the three inputs are a logic 0, the output will be a logic 1, because the majority gate illustrated is an inverting majority gate. Similarly, if two or three of the inputs were a logic 0, the output of the majority gate MG1 would be a logic 1. In essence, the majority gate MG1 will filter out those inputs that are not in line with the majority of inputs. The output of the majority gate MG1 is fed through a pass gate formed by transistors T13 and T14 back to node N1. Notably, the logic state of node M, which corresponds to the output of the majority gate MG1 or the logic state of the input D, is alternately passed to node N1 through the respective pass gates in response to the clock signal CLK or CLKb as inverted by inverter I2.

The temporal latch provides immunity to SETs in the following manner. If the input D temporarily transitions to the wrong logic state for a duration less than the delay δ, the resulting transient is passed to the majority gate MG1 through the three different feedback paths at different times. In particular, a delay of δ is provided between the transients that appear on the three feedback paths. Assuming the transient is less than the delay δ, the majority gate MG1 will only see the transient on one input at a time. Since there are three inputs, a transient on a minority input will not affect the output of the majority gate MG1. In other words, assuming the transient has a duration of less than the delay δ, two of the three feedback paths will always have the correct logic state and the output of the majority gate MG1 will be based on the correct logic states. The temporal latch basically filters out any transients on the input D where the transients have a duration less than the delay δ. In a similar fashion, the temporal latch will filter out transients appearing on the clock signal CLK or CLKb through the same overall feedback loop. In addition to addressing transients on the input D and the clock signal CLK, transients appearing in the feedback paths, such as along nodes N2, MDb, and MDDb, are filtered out as long as no two nodes are affected at the same time.

One drawback of the temporal latch is that it typically cannot handle simultaneous hits on multiple nodes in the feedback paths. Further drawbacks include not being able to provide immunity to SETs that last longer than the delay δ. Unlike the DICE latch of FIG. 1, the temporal latch tends to be quite large due to the number of transistors and other components required for the delay circuits D1, D2, and D3.

Accordingly, there is a need for a latch that overcomes the deficiencies of the temporal latch while maintaining its benefits.

SUMMARY OF THE INVENTION

The present invention provides a radiation hardened flip-flop formed from a modified temporal latch and a modified dual interlocked storage cell (DICE) latch. The temporal latch is configured as the master latch and provides four output storage nodes, which represent outputs of the temporal latch. The DICE latch is configured as the slave latch and is made of two cross-coupled inverter latches, which together provide four DICE storage nodes. The four outputs of the temporal latch are used to write the four DICE storage nodes of the DICE latch. The temporal latch includes at least one feedback path that includes a delay element, which provides a delay.

In one embodiment, a feedback configuration employs three feedback paths where each of the feedback paths drives two majority gates. One of the feedback paths includes a first delay element that provides a first delay, while another feedback path provides a second delay element that provides a second delay, which is larger, and preferably about twice that of the first delay. The output storage nodes are independent and derived from the outputs of the first and second delay elements and the outputs of the majority gates. The first delay is preferably set to last longer than a duration of a single event transient (SET) caused by a sensitive node being hit by a high energy radiation particle.

In a second embodiment, Muller C-gates are used in the feedback path. The first output storage node acts as a primary storage node and drives both a first input of a first delay element and a first input of a first Muller C-gate. The output of the first delay element drives the second input of the first Muller C-gate and provides the third output storage node. The output of the first Muller C-gate corresponds to the fourth storage node and drives both a first input of a second delay element and a first input of a second Muller C-gate. The output of the second delay element drives a second input of the second Muller C-gate and provides the second output storage node. Preferably, the delays provided by the first and second delay circuits are about the same. Further, each delay is preferably set to last longer than a duration of a single event transient caused by a sensitive node being hit by a high energy radiation particle.

In a third embodiment, the temporal latch is a cascade voltage switch logic (CVSL) latch having a central cross-coupled latch, which has a first main node and a second main node. The first main node and the second main node hold differential logic states corresponding to a latched input state. A first feedback path extends from the first main node to the second main node and includes a first delay element followed by a first transistor, which controls, at least in part, the first main node. A second feedback path extends from the second main node to the first main node and includes a second delay element followed by a second transistor, which controls, at least in part, the second main node. The first and second transistors allow the first and second main nodes to tri-state when single event transients occur on the respective feedback paths. The first output storage node is derived from the output of the second delay element; the second output storage node is derived from the first main node; the third output storage node is provided by the second main node; and the fourth output storage node is derived from the output of the first delay element. Further, each delay is preferably set to last longer than a duration of a single event transient caused by a sensitive node being hit by a high energy radiation particle.

In any of the above embodiments, the temporal latch and the DICE latch may be separated into segments, which include sensitive nodes. To increase radiation hardening, the segments of the temporal latch and the segments of the DICE latch may be interleaved, such that the sensitive nodes are relatively spaced apart from one another while allowing for a relatively compact layout. Preferably, the sensitive nodes are sufficiently spaced apart from one another to minimize the chance of any two of the sensitive nodes being hit by a single radiation particle. When multiple radiation hardened flip-flops are required, segments from the temporal latches and the DICE latches from each of the multiple flip-flops may be interleaved to provide even further radiation hardening while maintaining a compact layout.

In yet another embodiment, the output of the radiation hardened flip-flop is derived from the second and fourth DICE storage nodes of the DICE latch. Preferably, a first inverter is coupled between second DICE storage node and the output, and a second inverter is coupled between the fourth DICE storage node and the output. Notably, in any of the embodiments, elements may be provided before or after the described nodes to modify a logic state without veering from the concepts of the present invention or the definition of a particular node, as defined in the claims below. Such elements may include inverters and like logic gates.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 4:
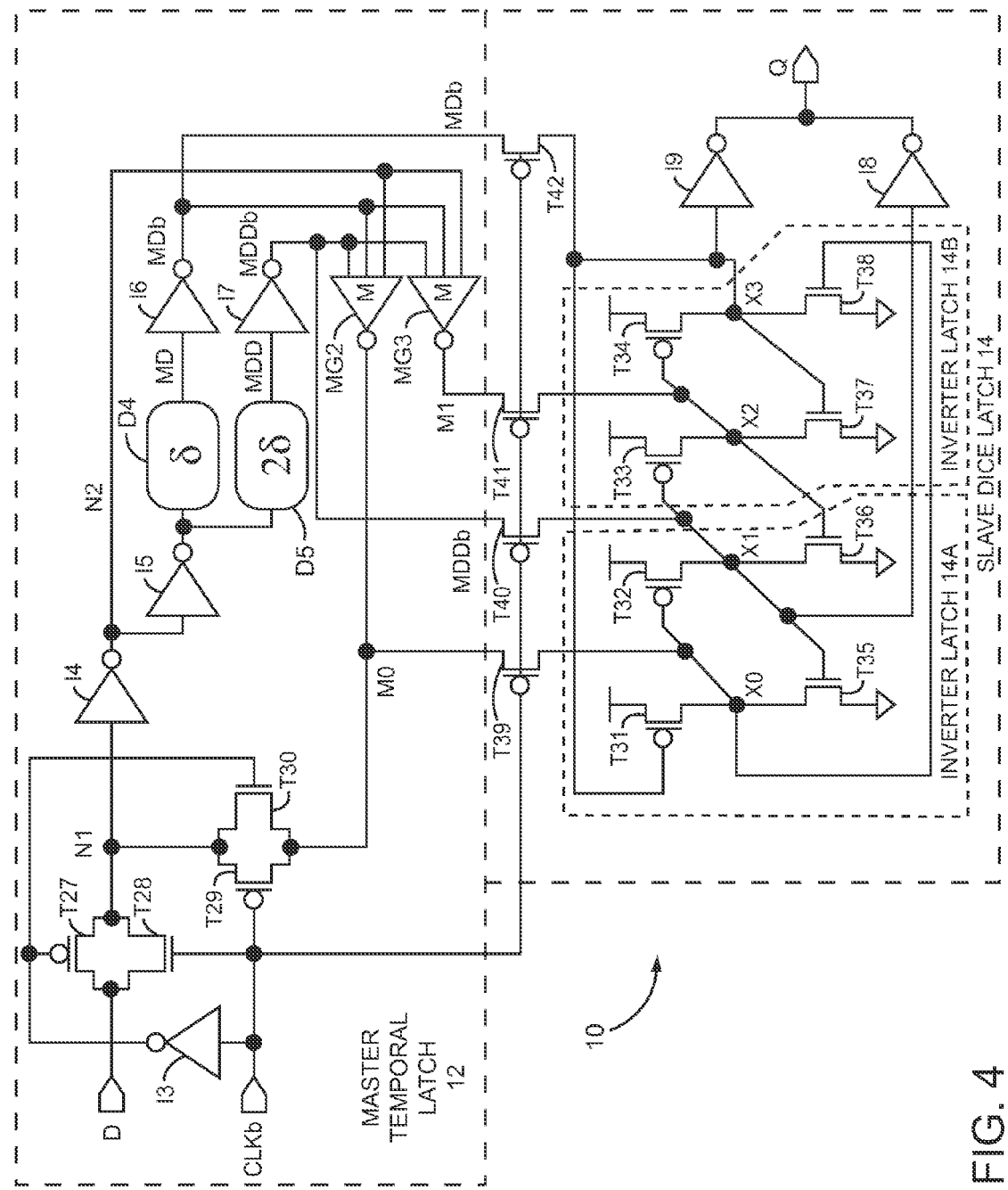
FIG. 4 illustrates a master-slave flip-flop according to one embodiment of the present invention.

The present invention provides a radiation hardened latch, and in particular, a radiation hardened flip-flop that employs modified versions of the classic DICE and temporal latches to form a D-type master-slave flip-flop (MSFF). A first embodiment of the present invention is illustrated in FIG. 4, where a MSFF 10 is illustrated to include a master temporal latch 12 and a slave DICE latch 14. As noted, the master temporal latch 12 is a modified version of the classic temporal latch illustrated in FIG. 2. The slave DICE latch 14 is a modified version of the classic DICE latch illustrated in FIG. 1. In this embodiment, the traditional DICE latch is modified to have two additional inputs. Further, the output of the slave DICE latch 14 is derived from node X1 and node X3 instead of only node X3. By employing four inputs in the slave DICE latch 14, the likelihood of two of the inputs being upset is minimized, especially given the independence of the four corresponding outputs of the master temporal latch 12, as outlined below.

Figure 1:
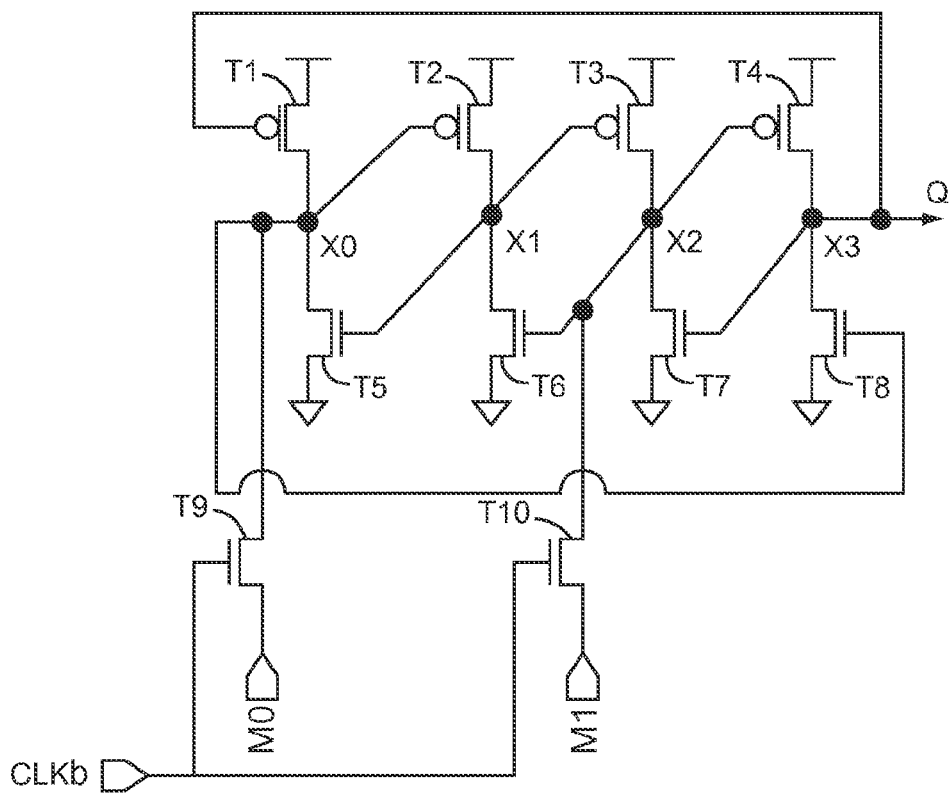
FIG. 1 illustrates a DICE latch according to the prior art.

The basic operation of the slave DICE latch 14 is substantially the same as that described in association with the traditional DICE latch of FIG. 1. Notably, transistors T31-T38 correspond to transistors T1-T8 of FIG. 1. The slave DICE latch 14 includes two cross-coupled inverter latches 14A, 14B formed from PMOS transistors T31-T34 and complementary NMOS transistors T35-T38. The first cross-coupled inverter latch is formed from transistors T31, T32, T35, and T36 while the second cross-coupled inverter latch 14B is formed from transistors T33, T34, T37, and T38.

Notably, node X0 is formed where transistors T31 and T35 are coupled, node X1 is formed where transistors T32 and T36 are coupled, node X2 is formed when transistors T33 and T37 are coupled, and node X3 is formed where transistors T34 and T38 are coupled. Node X0 is coupled to the gate of transistor T32 as well as the gate of transistor T38. Node X1 is coupled to the gates of transistors T35 and T33. Node X2 is coupled to the gates of transistors T36 and T34. Node X3 is coupled to the gates of transistors T37 and T31, and provides the output Q of the slave DICE latch 14.

The DICE latch 14 has four inputs that are connected to nodes X0-X3. These inputs are M0, M1, MDDb, and MDb, which are all provided as outputs from the master temporal latch 12. In particular, nodes M0, MDDb, M1, and MDb provide outputs from the master temporal latch 12 and represent inputs to the slave DICE latch 14. The logic state of node M0 is passed to node X0 through PMOS pass transistor T39, the logic state of node MDDb is passed to node X1 through PMOS pass transistor T40, the logic state of node M1 is passed to node X2 through PMOS pass transistor T41, and the logic state of node MDb is passed to node X3 through PMOS pass transistor T42. Notably, the pass transistors are active when the clock signal, CLKb, is asserted low. As noted, the output Q of the slave DICE latch 14 is derived from nodes X1 and X3. In particular, the nodes X1 and X3 are respectively coupled to inverters I8 and I9. The outputs of the inverters I8 and I9 are coupled together to form the output Q of the slave DICE latch 14, and the overall output of the MSFF 10.

The addition of the two extra inputs for the slave DICE latch 14 provides immunity to any one of the four inputs being at an incorrect logic level during transfers from the master temporal latch 12 to the slave DICE latch 14. To provide this immunity, the four inputs to the slave DICE latch 14, and thus the corresponding four outputs from the master temporal latch 12, are substantially independent of each other. The combination of nodes X1 and X3 to provide the output Q of the slave DICE latch 14 allows the output Q to recover more quickly in response to a SET that affects one of the two nodes X1 and X3.

Figure 2:
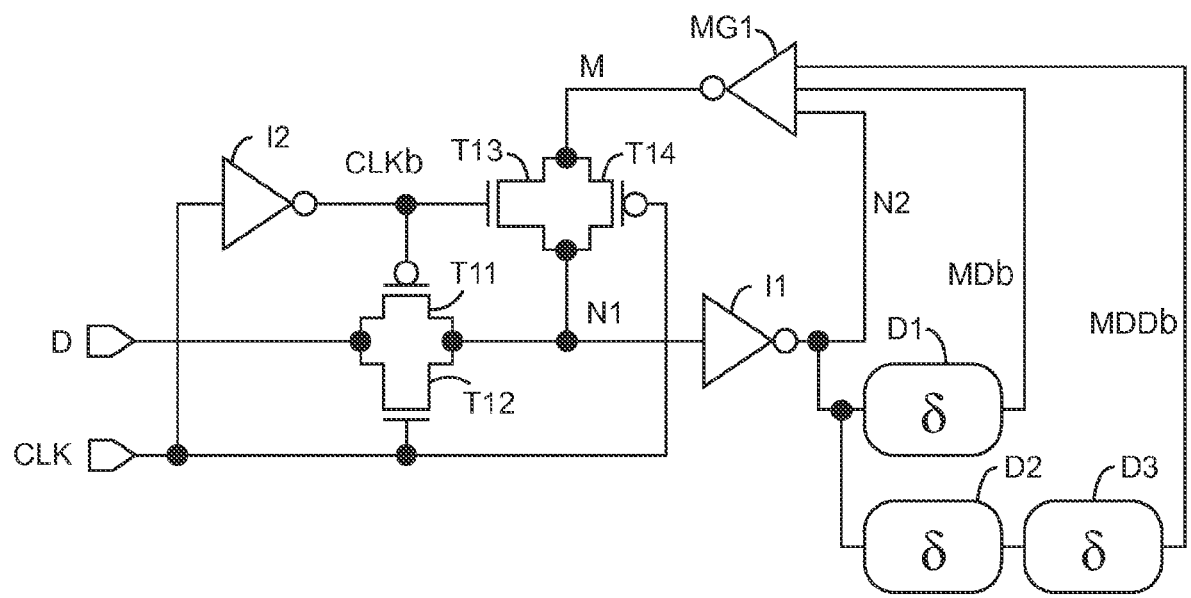
FIG. 2 illustrates a temporal latch according to the prior art.
Figure 3:
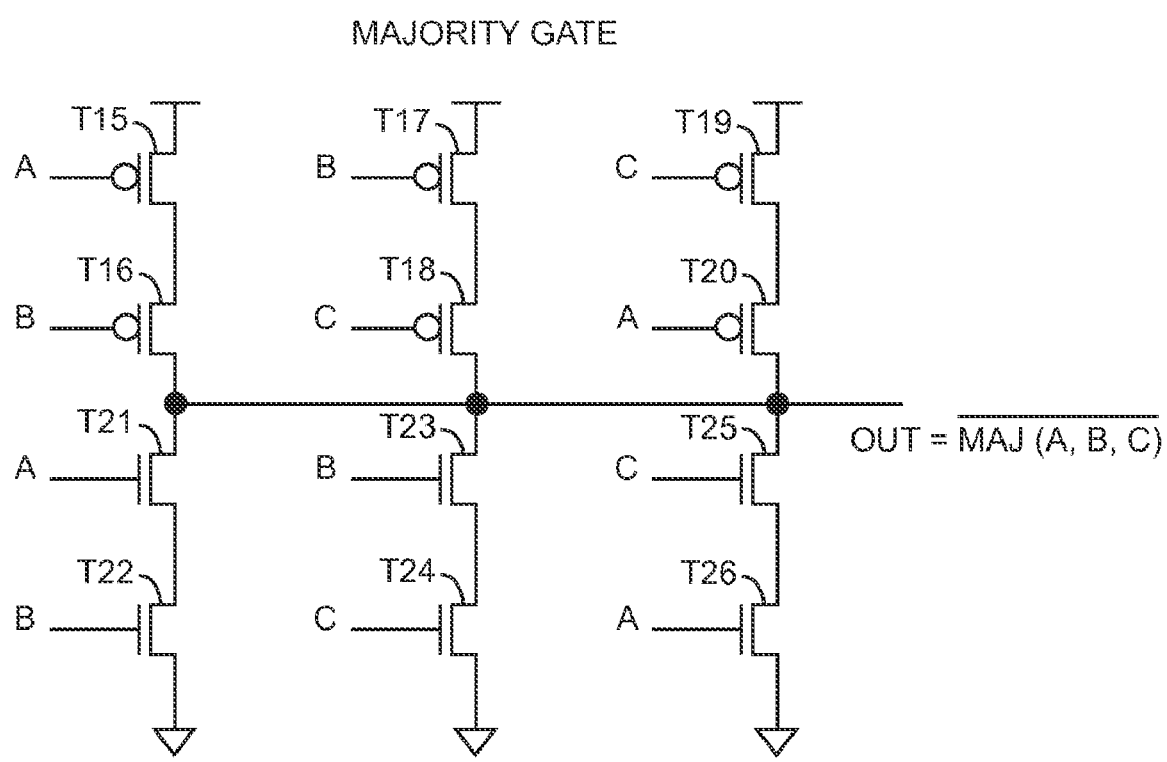
FIG. 3 illustrates a majority gate according to the prior art.

From the description of FIG. 2, the traditional temporal latch only provides three outputs. The master temporal latch 12 of FIG. 4 is modified to provide a fourth output. The four outputs of the master temporal latch 12 correspond to nodes M0, MDDb, M1, and MDb. To obtain the fourth output, another majority gate is added to the master temporal latch 12. As such, the master temporal latch 12 includes two majority gates MG2 and MG3. The master temporal latch 12 still includes three feedback paths, each of which is presented to both the majority gates MG2 and MG3. The first feedback path corresponds to node N2; the second feedback path corresponds to node MDb, the associated inverters I5 and I6, and delay circuitry D4; and the third feedback path corresponds to node MDDb, the associated inverters I5 and I7, and delay circuitry D5. Notably, delay circuitry D4 provides a single delay δ in the second feedback path, while delay circuitry D5 provides a double delay 2δ in the third feedback path. The operation of the three feedback paths is analogous to that described in association with FIG. 2. The inverter I4 drives each of the feedback paths based on the logic state at node N2, which corresponds to the input D. As described above, the input D is passed through a pass gate formed by transistors T27 and T28 when the clock signal CLKb is asserted high. When the clock signal CLKb is asserted low, the logic state of node M0, which is the output of the majority gate MG2, is passed through a pass gate formed by transistors T29 and T30 to node N1.

Notably, node M0 is used to drive node X0 and is the output of the majority gate MG2. Node MDDb is the output of the third feedback path, which has a 2δ delay and drives node X1. Node M1, which is the output of the majority gate MG3, drives node X2. The output of the second feedback path corresponding to node MDb and having a single delay δ drives node X3.

As described in association with FIG. 2, the presence of three feedback paths that have different delays allows the master temporal latch 12 to effectively filter out transients having a duration less than a delay δ on the input D, the clock signal CLK or CLKb, as well as any one of the feedback nodes N2, MDb, MDDb, or any other node along the feedback paths.

Examples of how the MSFF 10 responds to SETs follow. For the first example, assume that there have been no SETs and that an input D has been stored at node N1. Further assume that node N1 of the MSFF 10 is set at a logic 0 and has been set at a logic 0 for more than two δ delays. As such, nodes N2, MDb, and MDD are also logic 1s and nodes MD and MDD are logic 0s. Since nodes N2, MDb, and MDDb are logic 1s, nodes M0 and M1, which are the respective outputs of the majority gates MG2 and MG3, are logic 0s. When the clock signal CLKb is asserted to a logic 0, the logic 0s of nodes M0 and M2 are passed to nodes X0 and X2 of the slave DICE latch 14 via pass gate transistors T39 and T41, respectively. Also, the logic 1s of nodes MDDb and MDb are passed to nodes X1 and X3 of the slave DICE latch 14 via the pass gate transistors T40 and T42, respectively. Since nodes X1 and X3 are logic 1s, the inverters I8 and I9 cause the output Q of the slave DICE latch 14 to be a logic 0.

After the MSFF 10 has been written as described above, assume a SET in the form of an ionizing particle of radiation strikes node N2 of the master temporal latch 12. The excess electrons from the ionizing particle of radiation cause the node N2 to temporarily transition from a logic 1 to a logic 0 for less than one δ delay. Within one δ delay, node N2 will return to a logic 1. Notably, the transient at node N2 is propagated through the respective feedback paths provided by the one δ delay circuit D4 and the two δ delay circuit D5. After one δ delay, node MDb temporarily transitions to a logic 0 for less than one δ delay. After two delay delays, node MDDb temporarily transitions to a logic 0 for less than one δ delay. Notably, node N2 will have returned to a logic 1 before either of nodes MDb or MDDb temporarily transition to logic 0s. Similarly, node MDb will have returned to a logic 1 before node MDDb temporarily transitions to a logic 0. Since node MDb is delayed one δ delay from node N2 and node MDDb is delayed two δ delays from node N2, only one of the nodes N2, MDb, and MDDb are a logic 0 at any given time in response to the SET event at node N2.

Since only one of the nodes N2, MDb, and MDDb are a logic 0 at any given time, neither of the majority gates MG2 and MG3 react to the spaced apart transients appearing on the respective nodes. As such, the output nodes M0 and M1 of the master temporal latch 12 remain logic 0s despite the SET at node N2.

The SET at N2 may occur when the output nodes M0, M1, MDDb, and MDb of the master temporal latch 12 are being written to the slave DICE latch 14. As noted, the output nodes M0 and M1 of the master temporal latch 12 are unaffected; however, a transient on either of nodes MDDb or MDb may be passed to nodes X1 or X3, respectively. Since only one of the nodes X1 or X3 will see a transient at any given time, the remaining nodes of the slave DICE latch 14 will operate to correct the transient and not upset the proper state of the slave DICE latch 14, and thus the output Q.

For the second example, assume a SET impacts node X3 of the slave DICE latch 14. Assume that nodes M0 and M1 are logic 1s and nodes MDDb and MDb are logic 0s. Nodes M0, MDDb, M1, and MDb are the outputs of the mater temporal latch 12 and drive nodes X0, X1, X2, and X3, respectively, of the slave DICE latch 14, when the slave DICE latch is being written. As such, when the clock signal CLKb transitions from a logic 1 to a logic 0 and back to a logic 1, the logic states on nodes M0, MDDb, M1, and MDb are passed to nodes X0, X1, X2, and X3, respectively. Accordingly, after clock signal CLKb is asserted, nodes X0 and X2 are logic 0s and nodes X1 and X3 are logic 1s.

After the slave DICE latch 14 is written, assume a SET in the form of an ionizing particle of radiation strikes node X3. The excess electrons from the ionizing particle of radiation cause the node X3 to errantly transition from a logic 1 to a logic 0. As a result, PMOS transistor T31 turns on, when it should be turned off. Further, the NMOS transistor T37 turns off, when it should be turned on, and will no longer drive node X2. However, transistor T33 is already turned off and will allow node X2 to remain a logic 0; and therefore, keep PMOS transistor T34 turned on. NMOS transistor T35 is still turned on because node X1 is a logic 1, and PMOS transistor T34 is still turned on because node X2 is still a logic 0. Notably, PMOS transistor T34 will pull off the excess negative charge on node X3 and restore node X3 to a logic 1, such that the slave DICE latch 14 returns to its proper state. Although the output Q will have a transient glitch due to node X3 temporarily transitioning to a logic 0, the output Q is not upset and quickly returns to its proper state. The slave DICE latch 14 will respond in a similar fashion when any one of the nodes X0 through X3 are subjected to a SET event that changes the state of the affected node.

Figure 5:
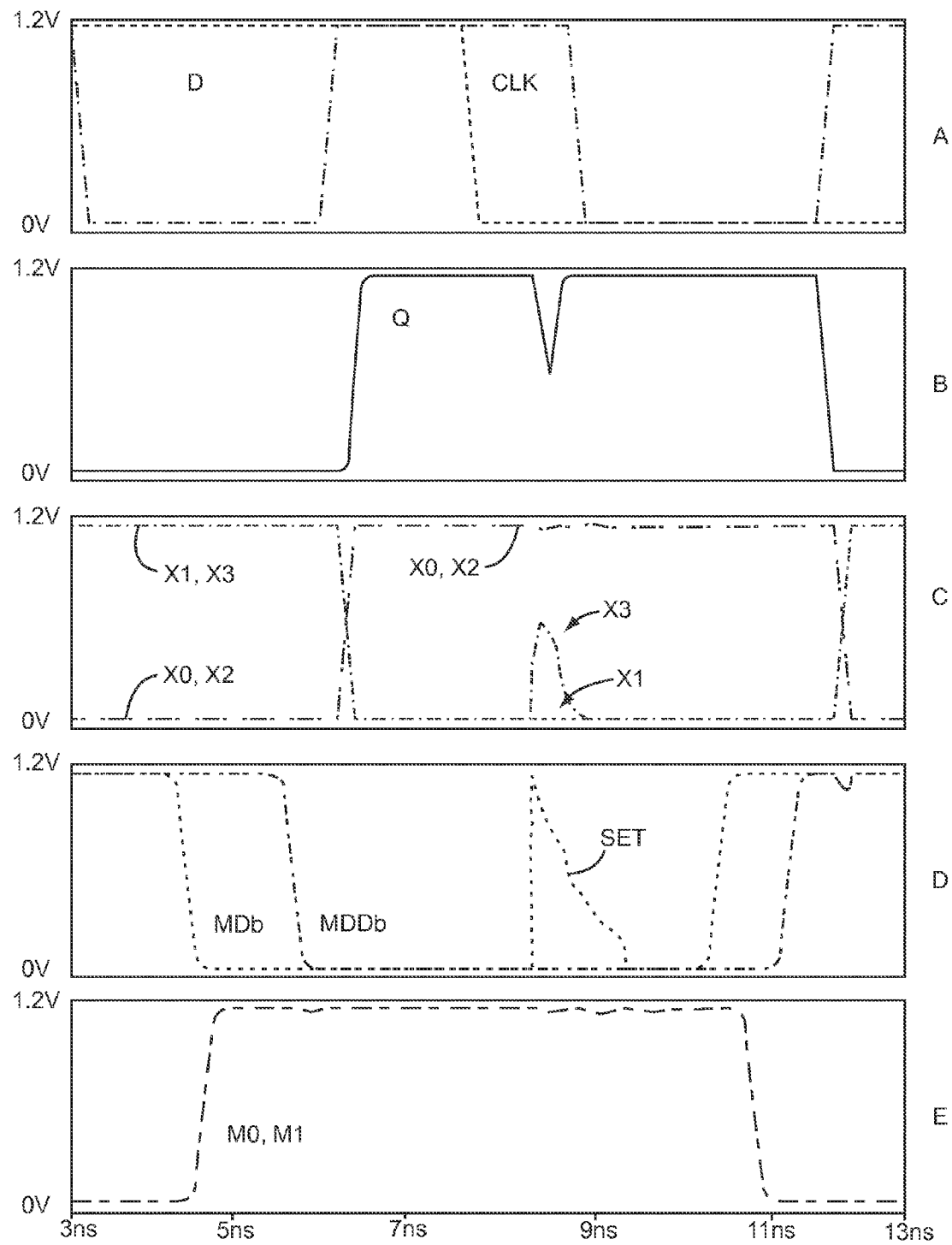
FIG. 5 illustrates a simulated signal diagram where a SET occurs on node MDb.

With reference to FIG. 5, simulated waveforms are provided to illustrate the effects of a SET occurring on nodes MDb in the master temporal latch 12. The waveforms are broken into five different sections referred to as sections A through E. Section A illustrates the input D and clock signal CLK, while section B illustrates the output Q provided by the slave DICE latch 14. Section C illustrates nodes X0-X3, section D illustrates nodes MDb and MDDb, and section E illustrates nodes M0 and M1. As noted, the SET occurs on MDb, while the clock signal CLK is transparent and thus asserted low, as illustrated in section D. As such, a disturbance is seen on node X3 that corresponds to the SET, which occurs on node MDb. Notably, nodes X0, X1, and X2 are undisturbed. Further, the output Q only shows a minor glitch corresponding to the SET that occurs on node MDb, and maintains the correct logic state.

Figure 6:
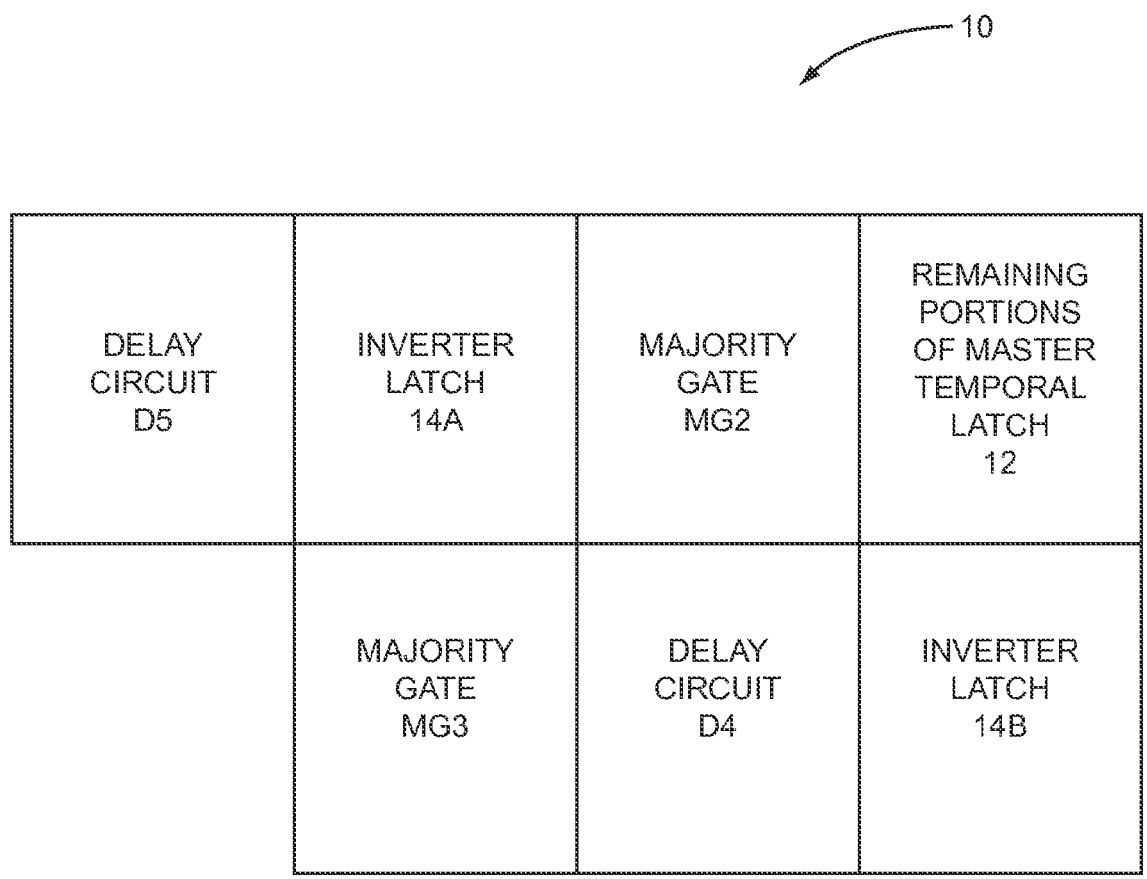
FIG. 6 illustrates a physical layout of a master-slave flip-flop according to one embodiment of the present invention.

Another potentially important aspect of designing the MSFF 10 is the physical layout of the various sections of the master temporal latch 12 and the slave DICE latch 14. As such, planning the spatial separation of the constituent circuit components of the MSFF 10 plays a significant role in the extent of radiation hardening. In one embodiment, the goal is to separate critical nodes M0, M1, MDb, and MDDb as well as interleaving the majority gates MG2 and MG3. An exemplary physical layout design is provided in FIG. 6. Notably, the MSFF 10 is divided into seven sub-cells. The slave DICE latch 14 is separated into two halves, which correspond to the inverter latch 14A and the inverter latch 14B. Reference is made to FIG. 4 to illustrate the components associated with the inverter latch 14A and the inverter latch 14B. As illustrated in FIG. 6, the inverter latches 14A and 14B are placed apart from one another to protect the storage nodes X0-X3. The delay circuits D4 and D5 of the master temporal latch 12 are placed on opposite sides of the layout, and the majority gates MG2 and MG3 are also separated from each other to prevent a single strike by a radiation particle from upsetting the state or inputs of the slave DICE latch 14. The remaining portions of the master temporal latch 12 reside in the upper right-hand corner of the layout. In one embodiment, each MSFF 10 is formed in a common substrate isolated by a guard ring, which is formed from heavily doped P-type material. The guard ring helps to address single event latch-up (SEL) effects as well as helping to alleviate TID induced diffusion-to-diffusion leakage.

Figure 7:
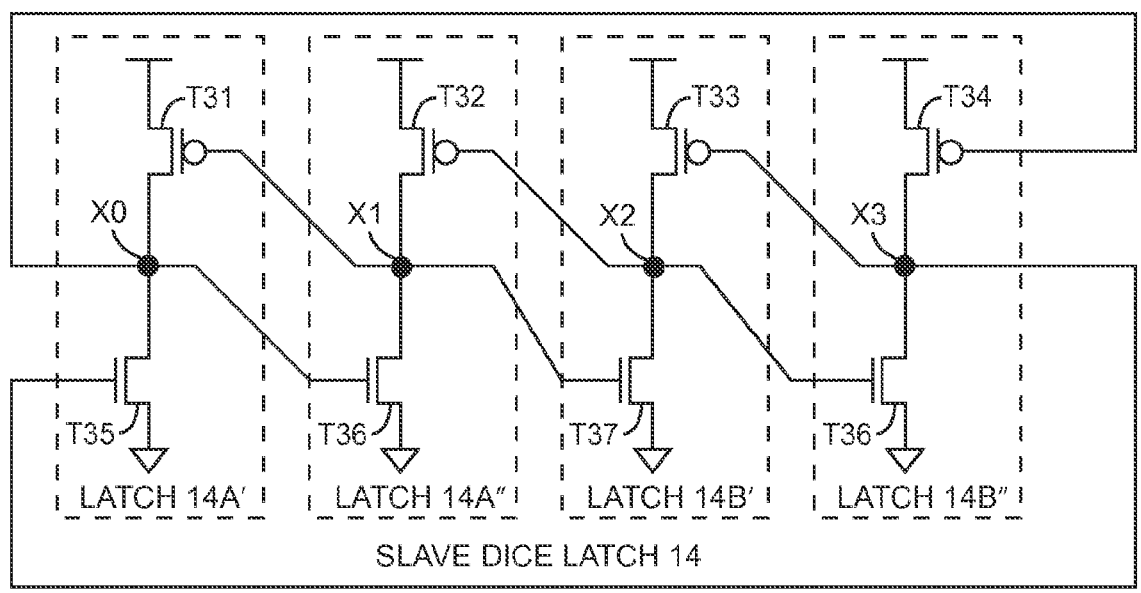
FIG. 7 illustrates a slave DICE latch according to one embodiment of the present invention.

With reference to FIG. 7, further hardening due to physical layout considerations may be provided by breaking the slave DICE latch 14 into four separate latches 14A', 14A'', 14B', and 14B''. Latches 14A' and 14A'' correspond to the inverter latch 14A, while latches 14B' and 14B'' correspond to the inverter latch 14B. By separating the slave DICE latch 14 into four separate latches 14A', 14A'', 14B', and 14B'', each of these latches may be physically separated from the others, and interleaved with other sub-cells, to further protect the corresponding nodes X0-X3 from simultaneous upset due to a single impinging radiation particle track.

Figure 8A:
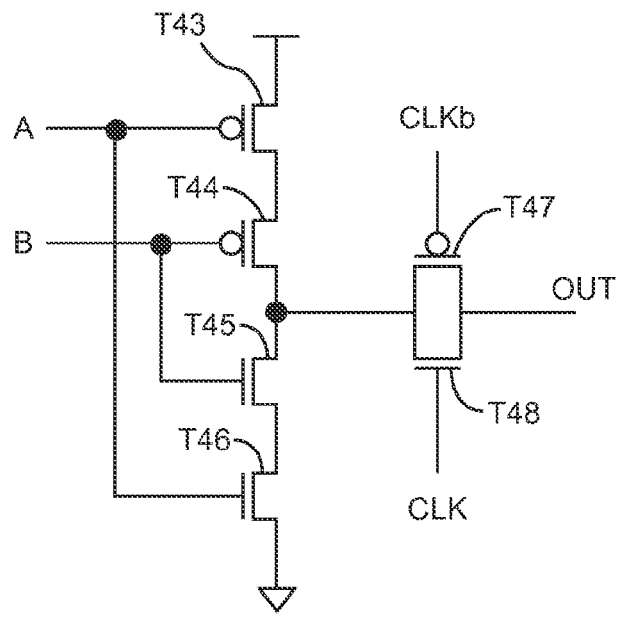
FIG. 8A illustrates a first exemplary Muller C-element connected in series with a CMOS transmission gate.

In 1959, David E. Muller disclosed the use of a C-element in asynchronous systems. The Muller C-element generally has N inputs and one output. Unless all of the inputs are at the same logic state, the output is tri-stated, and thus will float. When the inputs agree, a corresponding output is provided. A Muller C-element, which is referred to as a C-gate, is illustrated in FIG. 8A according to one embodiment of the present invention. A complementary transistor stack is created with PMOS transistors T43 and T44 and NMOS transistors T45 and T46, which are arranged in a complementary fashion. The C-gate has two inputs, A and B. Input A is coupled to the gates of the PMOS transistor T43 and the NMOS transistor T46. Similarly, input B is coupled to the gates of PMOS transistor T44 and the NMOS transistor T45. The output of the Muller C-Element drives a series transmission gate that is comprised of transistors T47 and T48, which allows the output to change only if inputs A and B agree, and if the signals CLK and CLKb are asserted high and low, respectively. Transistors T47 and T48 are respectively driven by clock signals CLKb and CLK. If inputs A and B are both a logic 1(0), then the output OUT will be a logic 0(1). When input A is not at the same logic state as input B, the output OUT will be tri-stated for the duration of time that the inputs A and B differ from one another. During the tri-stated period, the output OUT may float. Accordingly, the C-gate is similar to a majority gate, such as majority gates MG1-MG3, with the exception that the majority gate will provide a driven output even if one of the three inputs does not equal the other two inputs.

Figure 8C:
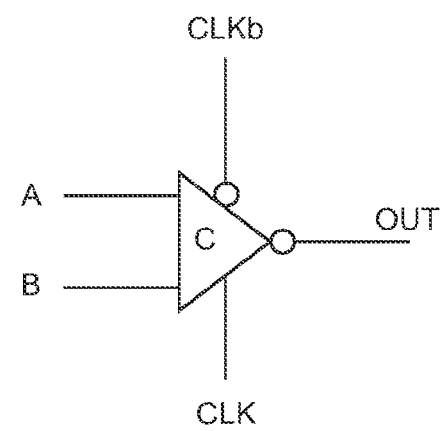
FIG. 8C depicts a symbol for a Muller C-element that is clock gated as in FIGS. 8A and 8B.
Figure 8B:
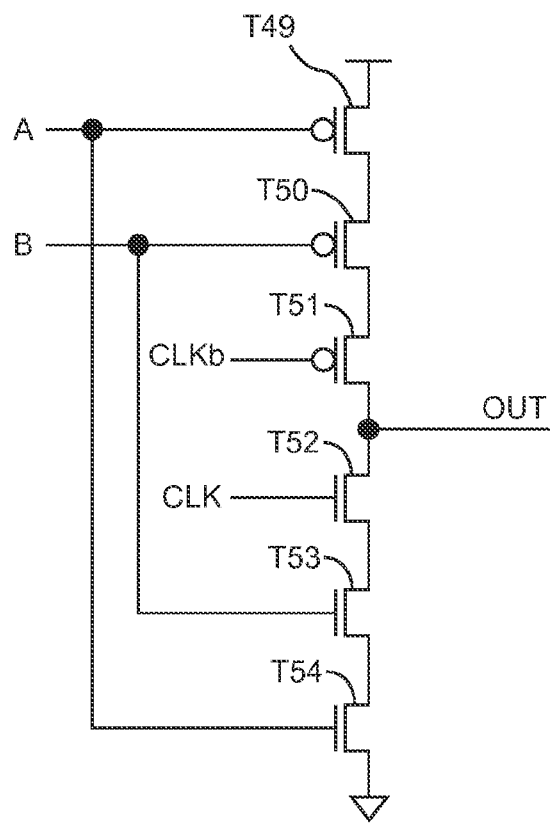
FIG. 8B illustrates a second exemplary Muller C-element that is tri-state-able.

An alternative C-gate configuration is provided in FIG. 8B, which has an output that is explicitly tri-stated by the controlling clock inputs CLK and CLKb. It is logically equivalent to the series connected Muller C-element and CMOS transmission gate in FIG. 8A. As illustrated, PMOS transistors T49-T51 are stacked with NMOS transistors T52-T54. Clock signals CLKb and CLK are respectively coupled to the gates of transistors T51 and T52. Input A is coupled to the gates of the PMOS transistor T49 and the NMOS transistor T54. Input B is coupled to the gates of PMOS transistor T50 and NMOS transistor T53. The operation of the C-gate in FIG. 8B is essentially the same as that of FIG. 8A. As such, if inputs A and B are both a logic 1(0), then the output OUT will be a logic 0(1). When the inputs A and B differ from one another, the output OUT is tri-stated while the inputs A and B are different. The output OUT is also tri-stated if the controlling clock signals are de-asserted, such as when clock signal CLK is low and clock signal CLKb is high. A symbol for a clock controlled C-gate that is configured according to the present invention is provided in FIG. 8C, wherein the C-gate has inputs A and B, clock signals CLK and CLKb, along with a single output OUT.

Figure 9:
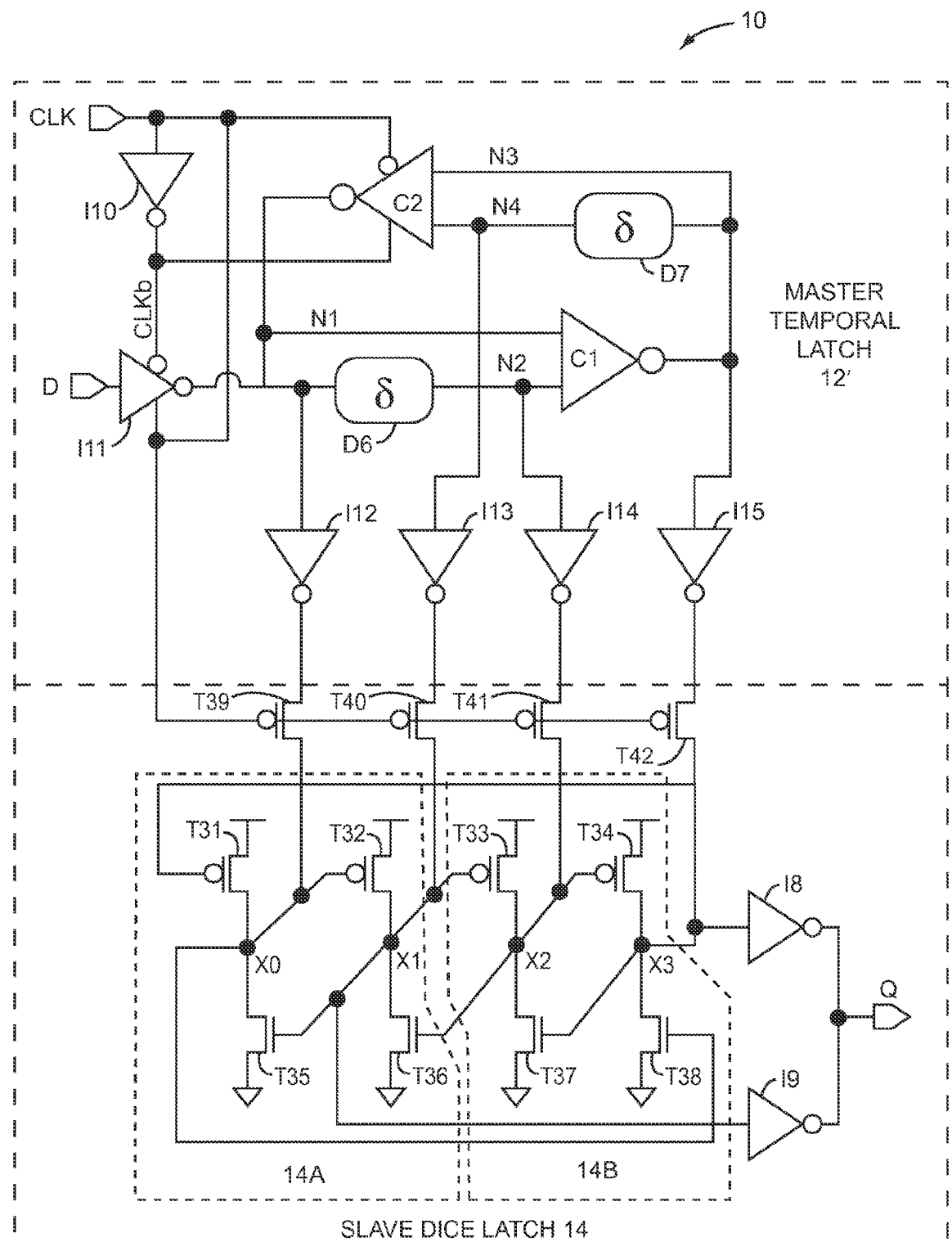
FIG. 9 illustrates a master-slave flip-flop according to a second embodiment of the present invention.

With reference to FIG. 9, an alternative master temporal latch 12' is illustrated in the MSFF 10. In particular, the master temporal latch 12' employs C-gates instead of majority gates. Notably, the master temporal latch 12' is coupled with a slave DICE latch 14, which is configured in the same way as those described above.

In operation, the input D is transferred to node N1 through tri-state inverter I11 when the inverted clock signal CLKb is asserted low. Assuming the input D is a logic 1, node N1 will fall to a logic 0 and be presented to one input of the C-gate C1. The logic 0 of node N1 is also presented to a delay circuit D6, which provides a delay of δ. Accordingly, after a δ delay, node N2 will fall to a logic 0. Since both inputs to the C-gate C1 are a logic 0, the output of the C-gate, which corresponds to node N3, is updated to a logic 1. Node N3 drives a second C-gate C2, and another delay circuit D7, which also provides a delay of δ. Accordingly, when node N3 transitions to a logic 1, node N4, which corresponds to the output of the delay circuit D7, will transition to a logic 1 after a δ delay. When both inputs of the second C-gate C2 become a logic 1, the output of the clock controlled C-gate C2, which corresponds to node N1, is driven to a logic 0 when the controlling signal clocks close the latch feedback path. Accordingly, the appropriate logic state is effectively stored at node N1 while the clock signal CLK is de-asserted. At this point, the storage nodes N1, N2, N3, and N4 are set up and stable.

These storage nodes N1, N2, N3, and N4 represent the four outputs of the master temporal latch 12', and are used to drive the four inputs of the slave DICE latch 14. After the falling edge of the clock signal CLK, the logic states of the output nodes N1, N2, N3, and N4 are written to the nodes X0, X1, X2, and X3 of the slave DICE latch 14. In particular, the logic state of storage node N1 is passed to node X0 through the inverter I12 and the pass transistor T39; the logic state of storage node N2 is passed to node X2 through the inverter I14 and the pass transistor T41; the logic state of storage node N3 is passed to node X3 through the inverter I15 and the pass transistor T42; and the logic state of the storage node N4 is passed to node X1 through inverter I13 and pass transistor T40. The delay from the falling edge of the clock signal CLK to the time the output Q of the slave DICE latch 14 settles is essentially one pass gate delay plus the inverter delay.

Figure 10:
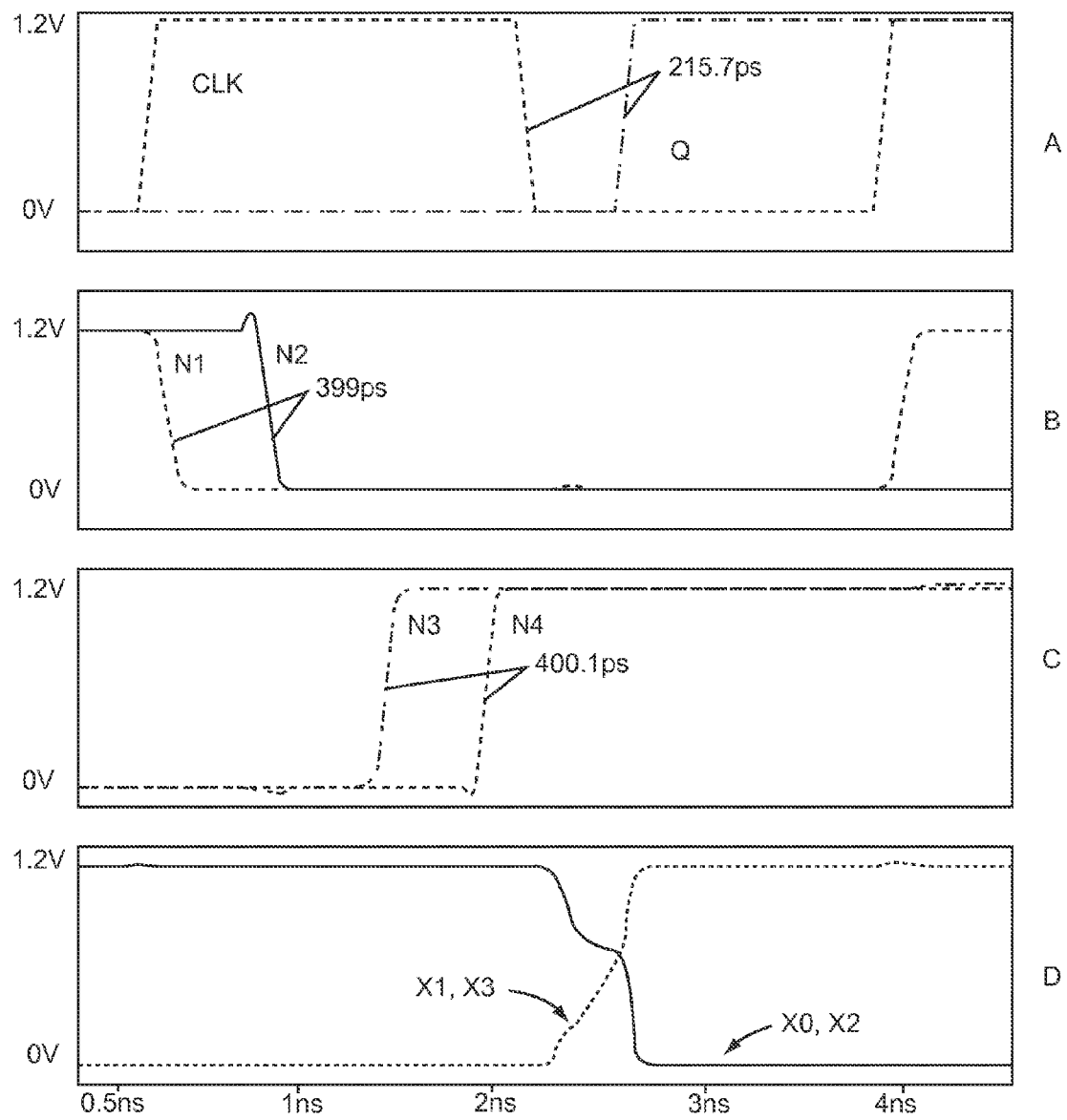
FIG. 10 illustrates a simulated signal diagram for normal operation of the master-slave flip-flop of FIG. 9.

A simulation of the waveforms for the clock signal CLK, output Q, storage nodes N1, N2, N3, and N4, and nodes X0, X1, X2, and X3 is illustrated in FIG. 10. Section A illustrates the relationship between the clock signal CLK and the output Q. Section B illustrates the relationship between storage nodes N1 and N2. In this example, the δ delay provided by the delay circuits D6 and D7 are approximately 400 picoseconds. Section C illustrates the relationship between storage nodes N3 and N4. Notably, the delay between the change in logic states at storage nodes N1 and N2 corresponds to the delay between the change in logic states at storage nodes N3 and N4. Section D depicts the change in states of nodes X0-X3 of the slave DICE latch 14.

Figure 11:
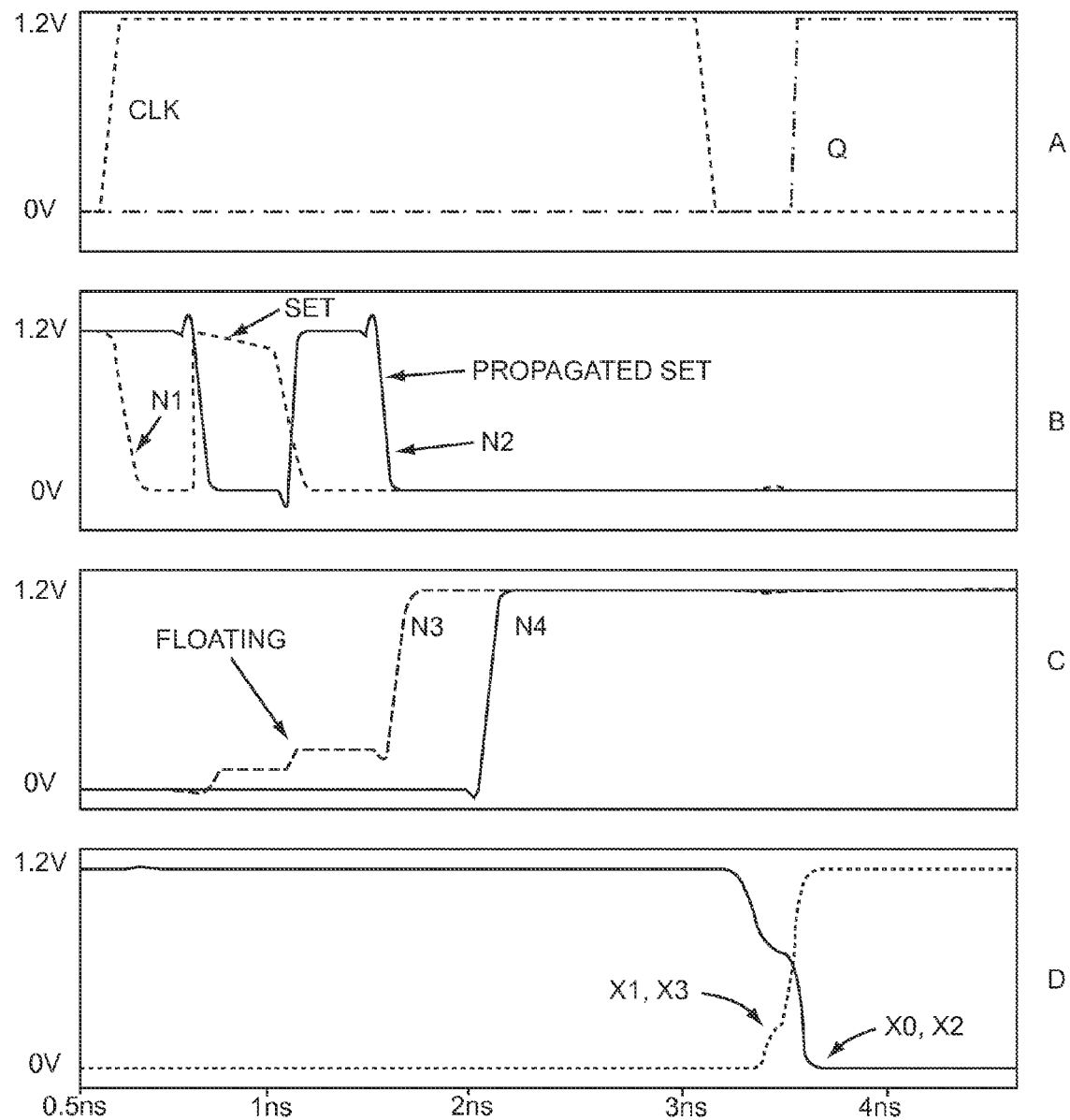
FIG. 11 illustrates a simulated signal diagram where a SET occurs on node N1.

With reference to FIG. 11, a simulated waveform is provided to illustrate the handling of a SET that occurs at the input D or storage node N1. Again, section A illustrates the clock signal CLK and the output Q. Notably, the output Q is not affected by the SET that occurs at the storage node N1. The SET that occurs at the storage node N1 is illustrated in section B. Notably, after the logic state at storage node N1 falls to a logic state 0, a SET occurs in the form of a short pulse. The SET occurring in storage node N1 is propagated to storage node N2 through the delay circuit D6. Accordingly, the SET appearing on storage node N2 appears after a δ delay from the time the SET occurred at the storage node N1. In section C, storage node N3, which corresponds to the output of the C-gate C1, floats during the time the SET is occurring on storage node N1 and when the SET is propagated to storage node N2. Again, the floating of storage node N3 is due to the tri-state output of the C-gate C1 when the inputs are at different logic states.

After both storage nodes N1 and N2 have recovered from the SET and the propagation of the SET, respectively, the logic value in storage node N3 transitions to a logic 1, which is the proper logic state for the storage node N3. Since the output of the C-gate C1 allows storage node N3 to float, the state of storage node N4 may remain relatively or completely undisturbed by the propagation of the SET. In essence, the output of the C-gate C1 may remain sufficiently low, such that the delay circuit D7 does not pass the transient change in logic state to storage node N4. Accordingly, the respective outputs provided by the storage nodes N1-N4 settle at the appropriate logic state prior to being written into the corresponding nodes X0-X3 of the slave DICE latch 14. As such, the transient does not make its way to the output Q, let alone upset the overall state of the slave DICE latch 14.

Figure 12:
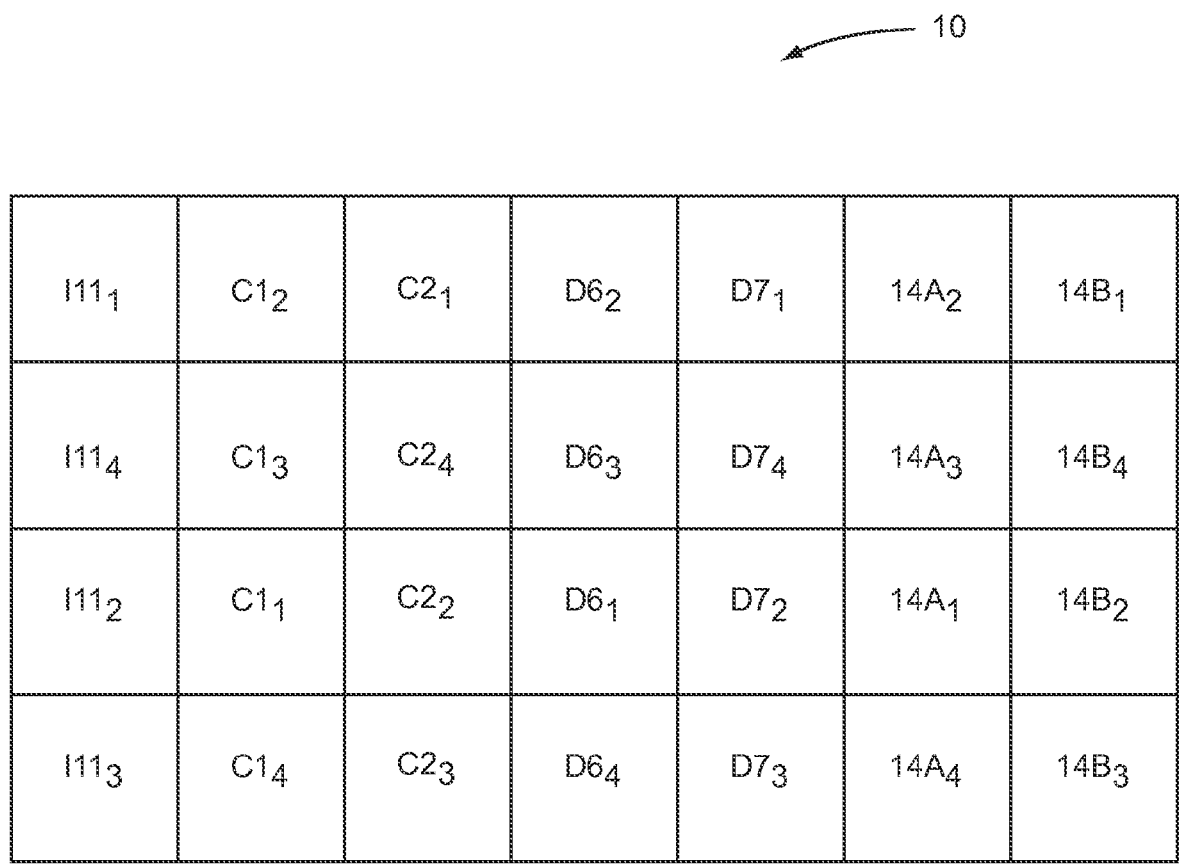
FIG. 12 illustrates a physical layout of four interlaced master-slave flip-flop according to a second embodiment of the present invention.

As with the MSFF 10 of FIG. 4, the MSFF 10 of FIG. 9 also benefits from a physical layout that separates critical nodes and circuit elements. With reference to FIG. 12, an exemplary physical layout is provided for four MSFFs 10. Notably, various sections of the different MSFFs 10 are interleaved amongst each other to provide significant radiation hardening for each MSFF 10 while minimizing the physical footprint required for implementing the four MSFFs 10. In this example, each MSFF 10 is broken into essentially seven primary sub-cells. These sub-cells include the input inverter I11$_z$, C-gate C1$_z$, C-gate C2$_z$, the delay circuitry D6$_z$ and related feedback path components, the delay circuitry D7$_z$ and related feedback path components, the inverter latch 14A$_z$, and the inverter latch 14B$_z$, where z identifies a unique MSFF 10. As illustrated, z equals four (4), and as such, four unique MSFFs 10 are provided in the layout. As such, the various segments for a given MSFF 10 are isolated by one or more sub-cells of other MSFFs 10, as depicted in FIG. 12. Those skilled in the art will recognize alternative ways of laying out the identified sub-cells as well as configuring more or less sub-cells to use when dividing the MSFF 10.

Figure 13:
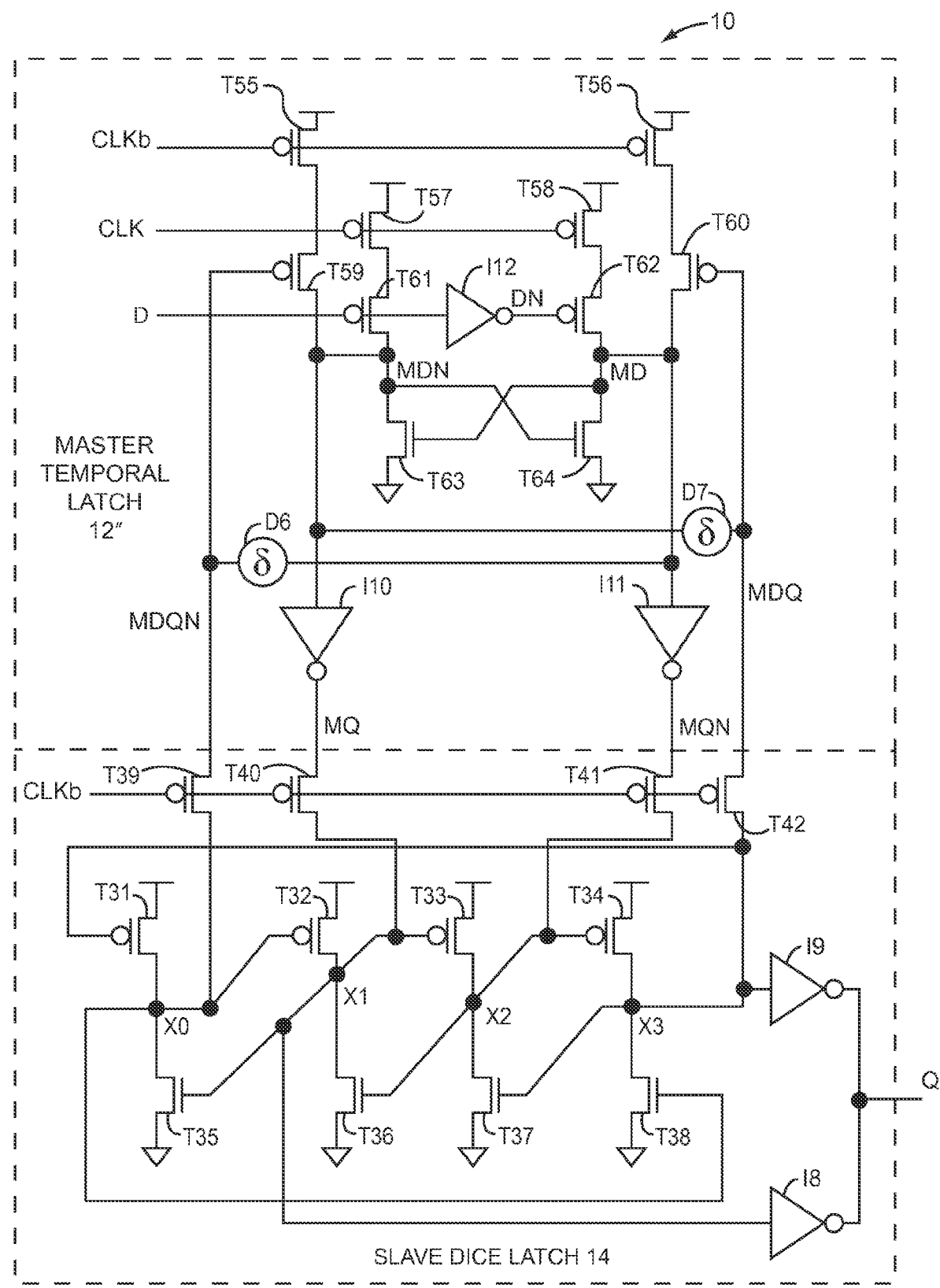
FIG. 13 illustrates a master-slave flip-flop according to a third embodiment of the present invention.

With reference to FIG. 13, yet another embodiment of an MSFF 10 is illustrated. In this embodiment, the same DICE latch 14 is employed as described above; however, an alternative master temporal latch 12" is used. The master temporal latch 12" provides the same overall functionality as the master temporal latch 12', which employed the C-gates C1 and C2 and was illustrated in FIG. 9. In particular, the master temporal latch 12" employs cascade voltage switch logic (CVSL) techniques. As with the other master temporal latches 12 and 12', the master temporal latch 12" provides four independent outputs to drive nodes X0-X3 of the slave DICE latch 14. The master temporal latch 12" only requires two delay circuits D6 and D7, and only requires a relatively small number of transistors to provide the latch and feedback functions required for operation.

As illustrated, the master temporal latch 12" includes PMOS transistors T55-T62 and NMOS transistors T63 and T64. The circuit also includes inverters I10-I11. The inputs to the master temporal latch 12" include input D and clock signals CLK and CLKb, wherein clock signal CLKb is the inverse of clock signal CLK. When the clock signal CLK is low, transistors T57 and T58 turn on and allow the input D to be written into the latch formed by the cross-coupled transistors T63 and T64. For example, if input D is a logic 1, transistor T61 is turned off. The logic 1 is inverted to a logic 0 by inverter I12, and thus drives node DN to a logic 0, which turns transistor T62 on. Since transistors T58 and T62 are on, node MD is charged to a logic 1. When node MD is a logic 1, transistor T63 is turned on and pulls node MDN to a logic 0. As such, the latch is set where node MDN is a logic 0 and node MD is a logic 1. These states are maintained when the clock signal CLK returns to an unasserted state.

Nodes MDN and MD reside at the beginning of two different feedback paths. The first feedback path extends from node MDN through delay circuitry D7, which provides a delay δ, to transistor T60. Transistor T60 is used to ensure that node MD remains at a logic 1 when node MD should be at a logic 1. When node MD is at a logic 0, transistor T60 is turned off. Similarly, node MD resides at the beginning of a feedback path that extends through delay circuitry D6, which provides a delay δ, to transistor T59. Transistor T59 is generally turned on when node MDN should be at a logic 1. In general, when node MD is at a logic 0, it will effectively turn transistor T59 on, which will hold node MDN at a logic 1. A logic 1 at node MDN will turn on transistor T64 and hold node MD at a logic 0. Further, since node MDN also controls transistor T60, when node MDN is a logic 0, transistor T60 is off and thereby allows node MD to remain at a logic 0. Such operation is reversed when node MDN is a logic 0 and node MD is a logic 1.

As noted above, the master temporal latch 12" provides four independent outputs to drive nodes X0-X3 of the slave DICE latch 14. As illustrated, these four independent outputs are derived from nodes MDQN, MQ, MQN, and MDQ. Node MDQN is derived from the output of the delay circuitry D6, while node MDQ is derived from the output of the delay circuitry D7. Notably, nodes MDQN and MDQ are generally at opposing logic states and are used to drive nodes X0 and X3 through pass transistors T39 and T42, respectively. Together, nodes MDQN and MDQ are referred to as delayed differential outputs of the master temporal latch 12". The other two outputs are provided by nodes MQ and MQN, which are referred to as differential outputs. Node MQ is derived from node MDN, and node MQN is derived from node MD. In particular, inverter I10 couples node MDN to node MQ, and inverter I11 couples node MD to node MQN. The pass transistors T40 and T41 pass the logic states of node MQ and node MQN, respectively, to nodes X1 and X2 of the slave DICE latch 14. The logic states of nodes MDQN, MQ, MQN, and MDQ are passed to the nodes X0-X3 of the slave DICE latch 14 when the clock signal CLKb is asserted low.

One aspect of radiation hardening for the master temporal latch 12" involves allowing nodes MDN or MD to tri-state when SETs adversely affect the feedback paths corresponding to transistors T59 and T60. As an example, assume that node MD is a logic 1 and node MDN is a logic 0. After a delay δ, node MDQN is a logic 1, node MQ is a logic 1, node MQN is a logic 0, and node MDQ is a logic 0. If node MDQ is struck by a radiation particle and temporarily transitions to a logic 1, transistor T60 is turned off while node MDQ is at a logic 1. As a result, node MD is tri-stated and allowed to float. Since node MD is already charged to a logic 1, the node will remain at a logic 1 until the SET has passed and node MDQ returns to a logic 0, wherein transistor T60 is turned back on.

When turned on, transistor T60 will maintain node MD at a logic 1. Similarly, if node MDN is a logic 1 and node MDQN is struck by a radiation particle and changes from a logic 0 to a logic 1, transistor T59 will turn off and allow node MDN to float in a tri-state mode.

The master temporal latch 12" is also immune to SETs occurring on nodes MDN or MD, as long as the SETs have a duration less than the delay δ. One aspect of this embodiment is the configuration of the latch transistors T63 and T64 to be significantly weaker than the PMOS transistors T55-T62, and at least transistors T59 and T60. If node MDN is at a logic 0 and experiences a SET that temporarily changes its state to a logic 1, transistor T64 could be turned on. However, because the transistor T60 is more powerful than transistor T64, which is easily ensured by using the appropriate MOSFET widths and lengths for the transistors, transistor T60 will overcome the attempt of transistor T64 to drive node M0 low and continue to drive transistor T63 to an on state. As such, transistor T60 will maintain node MD at a logic 1 and also keep transistor T63 turned on, thus returning node MDN to a logic 0. The propagation of these transients through the respective delay circuits D6 and D7 will keep the master temporal latch 12" in the appropriate state. Notably, any SETs occurring on nodes MDQN, MQ, MQN, and MDQ are handled by the slave DICE latch 14 as described above.

Those skilled in the art will recognize improvements and modifications to the preferred embodiments of the present invention. All such improvements and modifications are considered within the scope of the concepts disclosed herein and the claims that follow. Notably, in any of the embodiments, elements may be provided before or after the described nodes to modify a logic state without veering from the concepts of the present invention or the definition of a particular node, as defined in the claims below. Such elements may include inverters and like logic gates.

What is claimed is:

1. A radiation hardened flip-flop comprising:
  a temporal latch comprising:
    an input temporal node;
    feedback circuitry comprising at least one feedback path providing a first delay;
    a first output storage node, a second output storage node, a third output storage node, and a fourth output storage node, which are independent from each other and coupled to the input temporal node through the feedback circuitry; and
  a dual interlocked storage cell (DICE) latch comprising:
    a first DICE storage node selectively coupled to the first output storage node;
    a second DICE storage node selectively coupled to the second output storage node;
    a third DICE storage node selectively coupled to the third output storage node;
    a fourth DICE storage node selectively coupled to the fourth output storage node; and
    a DICE output node coupled to the at least one of the first, second, third, and fourth DICE storage nodes, wherein the DICE latch is a slave latch to the temporal latch.

2. The radiation hardened flip-flop of claim 1 further comprising a first inverter coupled between the fourth DICE storage node and the DICE output node and a second inverter coupled between the second DICE storage node and the DICE output node.

3. The radiation hardened flip-flop of claim 1 wherein the at least one feedback path comprises:
  a first feedback path extending from a primary storage node to a first input of a first majority gate and a first input of a second majority gate;
  a second feedback path comprising a first delay element adapted to provide the first delay and extending from the primary storage node to a second input of the first majority gate and a second input of the second majority gate; and
  a third feedback path comprising a second delay element adapted to provide a second delay and extending from the primary storage node to a third input of the first majority gate and a third input of the second majority gate, wherein the second delay is greater than the first delay.

4. The radiation hardened flip-flop of claim 3 wherein the first output storage node corresponds to an output of the first majority gate, the second output storage node corresponds to an output of the second delay element, the third output storage node corresponds to an output of the second majority gate, and the fourth output storage node corresponds to an output of the second delay element.

5. The radiation hardened flip-flop of claim 3 wherein the second delay is around about twice the first delay.

6. The radiation hardened flip-flop of claim 3 wherein the first delay is set to last longer than an estimated duration of a single event transient caused by a sensitive node of the temporal latch being hit by a particle of radiation.

7. The radiation hardened flip-flop of claim 3 further comprising:
a first inverter coupled between an output of the first delay element, the second input of the first majority gate, and the second input of the second majority gate; and
a second inverter coupled between an output of the second delay element, the second input of the first majority gate, and the second input of the second majority gate.

8. The radiation hardened flip-flop of claim 1 wherein the at least one feedback path comprises a first Muller C-gate, a second Muller C-gate, a first delay element adapted to provide the first delay, and a second delay element adapted to provide a second delay wherein:
a first input of the first Muller C-gate is coupled to the first output storage node;
the first delay element is coupled between the first output storage node and a second input of the first Muller C-gate to provide the third output storage node;
a first input of the second Muller C-gate is coupled to an output of the first Muller C-gate to provide the fourth output storage node; and
the second delay element is coupled between the output of the first Muller C-gate and a second input of the second Muller C-gate to provide the second output storage node.

9. The radiation hardened flip-flop of claim 8 wherein an output of the second Muller C-gate is coupled to the first output storage node.

10. The radiation hardened flip-flop of claim 8 further comprising:
a first inverter and a first pass transistor to selectively couple the first DICE storage node and the first output storage node;
a second inverter and a second pass transistor to selectively couple the second DICE storage node and the second output storage node;
a third inverter and a third pass transistor to selectively couple the third DICE storage node and the third output storage node;
a fourth inverter and a fourth pass transistor to selectively couple the fourth DICE storage node and the fourth output storage node.

11. The radiation hardened flip-flop of claim 8 wherein an input from the input temporal node is initially stored at the first output storage node upon being written to the temporal latch.

12. The radiation hardened flip-flop of claim 8 wherein the first delay is approximately equal to the second delay.

13. The radiation hardened flip-flop of claim 12 wherein the first delay and the second delay are set to last longer than an estimated duration of a single event transient caused by a sensitive node of the temporal latch being hit by a particle of radiation.

14. The radiation hardened flip-flop of claim 1 wherein the temporal latch employs cascade voltage switch logic (CVSL).

15. The radiation hardened flip-flop of claim 14 further comprising:
cross-coupled latch circuitry coupled to the input temporal node and adapted to provide a first logic state corresponding to an input logic state at a first main node and a second logic state that is the opposite of the first logic state at a second main node, wherein the second output storage node is coupled to the first main node and the third output storage node is coupled to the second main storage node;
a first delay element adapted to provide the first delay and residing in the at least one feedback path between the first main node and a first transistor that controls the second main node, wherein an output of the first delay element provides the fourth output storage node; and
a second delay element adapted to provide a second delay and residing in the at least one feedback path between the second main node and a second transistor that controls the first main node, wherein an output of the second delay element provides the first output storage node.

16. The radiation hardened flip-flop of claim 15 wherein the second main node is configured to tri-state when the first transistor is temporarily turned off due to a single event transient on the fourth output storage node, and the first main node is configured to tri-state when the second transistor is temporarily turned off due to a single event transient on the first output storage node.

17. The radiation hardened flip-flop of claim 15 wherein the first delay is approximately equal to the second delay.

18. The radiation hardened flip-flop of claim 17 wherein the first delay and the second delay are set to last longer than an estimated duration of a single event transient caused by a sensitive node of the temporal latch being hit by a particle of radiation.

19. The radiation hardened flip-flop of claim 1 wherein the first output storage node and the third output storage node normally reside at a first logic state, and the second output storage node and the fourth output storage node normally reside at a second logic state, which is opposite the first logic state.

20. The radiation hardened flip-flop of claim 1 further comprising:
a first pass transistor of a first type selectively coupling the first DICE storage node and the first output storage node;
a second pass transistor of the first type selectively coupling the second DICE storage node and the second output storage node;
a third pass transistor of the first type selectively coupling the third DICE storage node and the third output storage node; and
a fourth pass transistor of the first type selectively coupling the fourth DICE storage node and the third output storage node.

21. The radiation hardened flip-flop of claim 7 wherein the first type is a PMOS transistor.

22. The radiation hardened flip-flop of claim 1 wherein:
the temporal latch is separated into a plurality of temporal circuit sub-cells;
the DICE latch is separated into a plurality of DICE circuit sub-cells; and
the plurality of temporal circuit sub-cells are spatially interleaved with the plurality of DICE circuit sub-cells to separate sensitive nodes of the plurality of temporal circuit sub-cells and the plurality of DICE circuit sub-cells sufficiently to minimize a possibility of any two of the sensitive nodes from being hit at the same time by a single radiation particle.

23. The radiation hardened flip-flop of claim 1 wherein:
the temporal latch is separated into a first plurality of temporal circuit sub-cells;
the DICE latch is separated into a first plurality of DICE circuit sub-cells; and
the first plurality of temporal circuit sub-cells and the first plurality of DICE circuit sub-cells are spatially interleaved with a corresponding plurality of DICE sub-cells and temporal circuit sub-cells of at least one other radiation hardened flip-flop to separate sensitive nodes of the plurality of temporal circuit sub-cells, the plurality of DICE circuit sub-cells, and the plurality of DICE sub-cells and temporal circuit sub-cells of at least one other radiation hardened flip-flop sufficiently to minimize a possibility of any two of the sensitive nodes from being hit at the same time by a single radiation particle.

24. The radiation hardened flip-flop of claim 1 wherein the DICE latch comprises a first cross-coupled inverter latch providing the first DICE storage node and the second DICE storage node, and a second cross-coupled inverter latch providing the third DICE storage node and the fourth DICE storage node.

\* \* \* \* \*